(12) United States Patent
Morikawa et al.

(10) Patent No.: US 7,741,724 B2
(45) Date of Patent: Jun. 22, 2010

(54) SEMICONDUCTOR DEVICE

(75) Inventors: Shigehiro Morikawa, Gunma (JP); Yuichi Inaba, Gunma (JP); Yuji Goto, Gunma (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 192 days.

(21) Appl. No.: 12/060,673

(22) Filed: Apr. 1, 2008

(65) Prior Publication Data

US 2008/0237877 A1 Oct. 2, 2008

(30) Foreign Application Priority Data

Apr. 2, 2007 (JP) ............................. 2007-096327

(51) Int. Cl.
*H01L 23/48* (2006.01)
(52) U.S. Cl. .................. 257/786; 257/700; 257/758; 257/773; 257/775; 257/784
(58) Field of Classification Search .............. 257/499, 257/736, 773, E23.175, 700, 758, 775, 784, 257/786
See application file for complete search history.

(56) References Cited

U.S. PATENT DOCUMENTS

| | | | | |
|---|---|---|---|---|
| 4,795,500 A | * | 1/1989 | Kishi et al. ................. | 136/244 |
| 6,143,396 A | * | 11/2000 | Saran et al. ................. | 428/162 |
| 7,312,530 B2 | | 12/2007 | Hashimoto et al. | |
| 7,420,280 B1 | * | 9/2008 | Kelkar .......................... | 257/773 |
| 2002/0017672 A1 | * | 2/2002 | Ker et al. .................... | 257/303 |
| 2002/0195723 A1 | * | 12/2002 | Collette ...................... | 257/786 |
| 2005/0067707 A1 | * | 3/2005 | Hashimoto et al. .......... | 257/758 |

FOREIGN PATENT DOCUMENTS

| | | |
|---|---|---|
| JP | 05-343466 | 12/1993 |
| JP | 06-196525 | 7/1994 |
| JP | 06-283682 | 10/1994 |
| JP | 09-312332 | 12/1997 |
| JP | 2002-110731 | 4/2002 |
| JP | 2005-123587 | 5/2005 |

* cited by examiner

*Primary Examiner*—Leonardo Andújar
*Assistant Examiner*—Jordan Klein
(74) *Attorney, Agent, or Firm*—Morrison & Foerster LLP (57) ABSTRACT

This invention is directed to offer a semiconductor device having a structure capable of relaxing a mechanical stress applied to a bonding pad. A third interlayer insulation film having via holes is formed on a second interlayer insulation film to cover a third wiring layer. A third conductive layer is formed in the via hole. The third interlayer insulation film is composed of an array of a plurality of hexagonal column-shaped interlayer insulation films. And the via hole and the third conductive layer are formed to surround each hexagonal column-shaped interlayer insulation film. A fourth wiring layer connected with the third wiring layer through the third conductive layer is formed. The fourth wiring layer makes an uppermost wiring layer in an embodiment of this invention and serves as the bonding pad.

10 Claims, 6 Drawing Sheets

RESULTS OF EVALUATIONS

| | AMOUNT OF OVERDRIVE | NUMBER OF TESTS | 4M-3M CRACKS | | | 3M-2M CRACKS | |
|---|---|---|---|---|---|---|---|
| | | | PROBE CARD A RATE OF OCCURRENCE [%] | PROBE CARD B RATE OF OCCURRENCE [%] | | PROBE CARD A RATE OF OCCURRENCE [%] | PROBE CARD B RATE OF OCCURRENCE [%] |
| FIRST STRUCTURE | 65um | 102 | 58.8 | 84.3 | | 0.00 | 0.00 |
| | 75um | 101 | 84.2 | 96.1 | | 0.00 | 0.00 |
| | 85um | 102 | 99.0 | 99.0 | | 0.00 | 0.00 |
| | 95um | 102 | 99.0 | 100.0 | | 0.00 | 0.00 |
| | 105um | 102 | 100.0 | 100.0 | | 0.00 | 0.23 |
| SECOND STRUCTURE | 65um | 102 | 94.1 | 96.1 | | 0.00 | 0.00 |
| | 75um | 101 | 99.0 | 100.0 | | 0.00 | 0.00 |
| | 85um | 102 | 100.0 | 100.0 | | 0.00 | 0.00 |
| | 95um | 102 | 100.0 | 100.0 | | 0.00 | 0.93 |
| | 105um | 102 | 100.0 | 100.0 | | 0.47 | 3.02 |
| THIRD STRUCTURE | 65um | 101 | 51.5 | 93.1 | | 0.00 | 0.00 |
| | 75um | 102 | 79.4 | 98.0 | | 0.00 | 0.00 |
| | 85um | 102 | 99.0 | 100.0 | | 0.00 | 0.00 |
| | 95um | 102 | 100.0 | 100.0 | | 0.00 | 0.58 |
| | 105um | 102 | 100.0 | 100.0 | | 0.58 | 1.40 |

SEMICONDUCTOR DEVICE

CROSS-REFERENCE OF THE INVENTION

This application claims priority from Japanese Patent Application No. 2007-096327, the content of which is incorporated herein by reference in its entirety.

BACKGROUND OF THE INVENTION

1. Field of the Invention

This invention relates to a semiconductor device, specifically to a semiconductor device provided with a multi-layer wiring structure in which a plurality of wiring layers is stacked through interlayer insulation films.

2. Description of the Related Art

An IC (Integrated Circuit) chip is provided with bonding pads (external terminals) which serve to supply a multitude of semiconductor elements formed in the IC chip with predetermined voltages (a power supply voltage, a ground voltage and the like) and various electric signals or to output various electric signals to outside of the IC.

Figure 4:
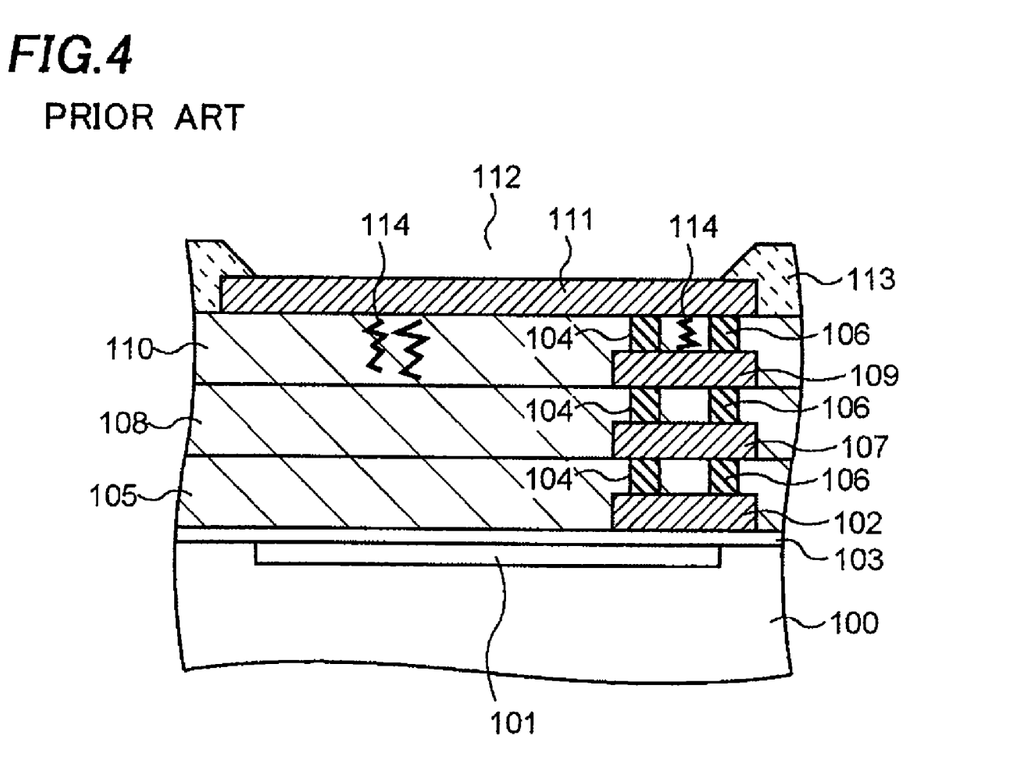
FIG. 4 is a cross-sectional view showing a conventional semiconductor device.

FIG. 4 is a cross-sectional view showing an outline of a region of a conventional semiconductor device, in which a bonding pad is formed. Device elements 101 composed of a multitude of semiconductor elements such as transistors and capacitors are formed on a surface of a semiconductor substrate 100. A first wiring layer 102 that is electrically connected with the device elements 101 through a wiring (not shown) is formed on the surface of the semiconductor substrate 100 through an insulation film 103 made of a silicon oxide film or the like.

A first interlayer insulation film 105 having via holes 104 is formed on the insulation film 103 to cover the first wiring layer 102. A conductive layer 106 made of tungsten or the like is formed in each of the via holes 104. A second wiring layer 107 electrically connected with the first wiring layer 102 through the conductive layer 106 is formed on the first interlayer insulation film 105. Similarly, a second interlayer insulation film 108 is formed on the first interlayer insulation film 105, a third wiring layer 109 and a third interlayer insulation film 110 are formed on the second interlayer insulation film 108 and a fourth wiring layer 111 is formed on the third interlayer insulation film 110. The fourth wiring layer 111 serves as the bonding pad. The fourth wiring layer 111 is disposed in an area overlapping the device elements 101 for a purpose of reducing a die size. A protection film 113 having an opening on the fourth wiring layer 111 is formed on the third interlayer insulation film 110.

A test probe or a lead wire touches the fourth wiring layer 111 exposed in the opening 112 during probe testing or wire bonding. During the probe testing, a large mechanical stress is caused by a pressure of the test probe made of tungsten, nickel alloy or the like and converges in a region below the fourth wiring layer 111. Also, during the wire bonding, a large mechanical stress converges in the region below the fourth wiring layer 111 by influence of ultrasonic energy or the lead wire. As a result, in some cases, cracks 114 are caused in the third interlayer insulation film 110 under the fourth wiring layer 111.

Furthermore, in some cases, the cracks 114 reach the interlayer insulation film (the second interlayer insulation film 108 or the first interlayer insulation film 105) or the wiring layer (the third wiring layer 109, the second wiring layer 107 or the first wiring layer 102), that is further below the third interlayer insulation film 110. In those cases, the cracks 114 cause deterioration in metal migration resistance or a short circuit failure between wirings, because a corrosive material such as water infiltrates into the inside through the cracks 114.

Figure 5:
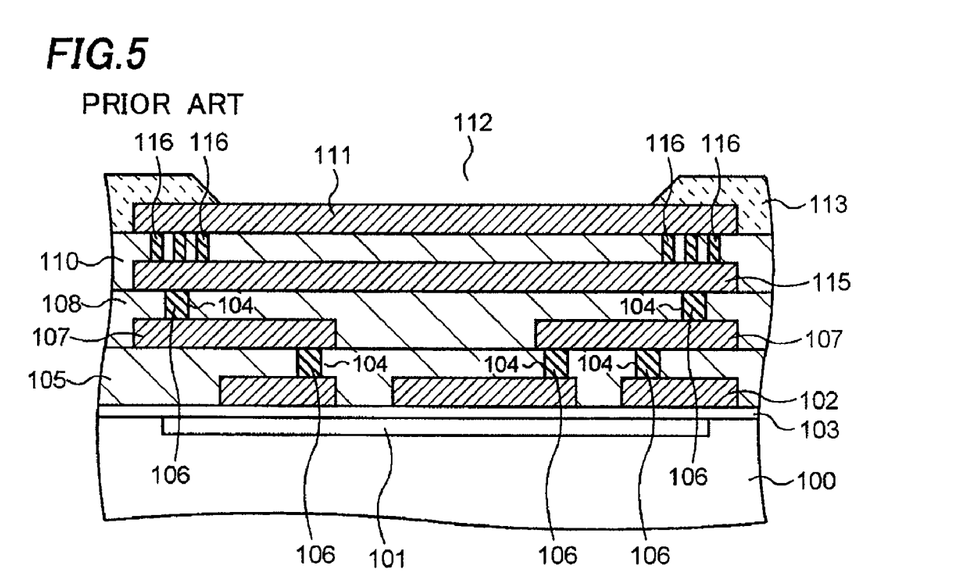
FIG. 5 is a cross-sectional view showing a conventional semiconductor device.
Figure 6:
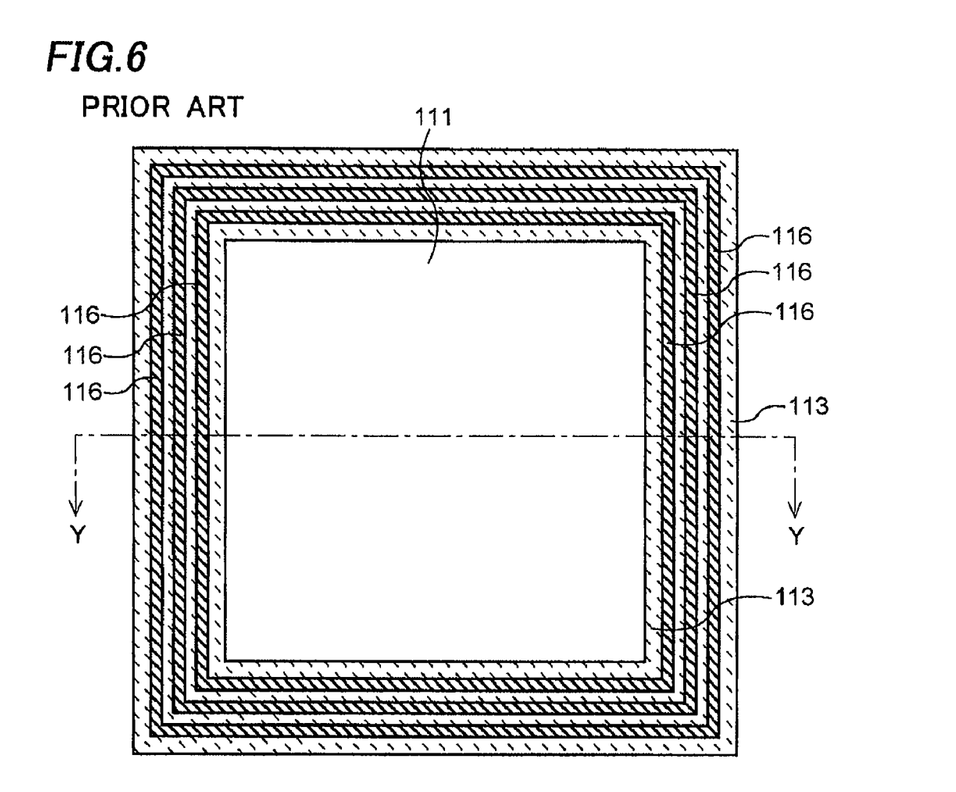
FIG. 6 is a plan view showing the conventional semiconductor device.

Following technologies are proposed to suppress the deterioration in reliability due to the cracks 114. One of the technologies is implemented by a structure in which approximately the same size of the third wiring layer 115 as the fourth wiring layer 111 is disposed so as to overlap each other and the conductive layers 116 that electrically connect the fourth wiring layer 111 with the third wiring layer 115 are disposed only below the protection film 113 in a shape of rectangular rings as shown in FIG. 5 and FIG. 6. Even if the cracks 114 are caused, with the structure provided with the third wiring layer 115 and the conductive layer 116 in the shape of rectangular rings, the downward propagation of the cracks 114 would be blocked by the third wiring layer 115. FIG. 5 is a cross-sectional view of a section Y-Y shown in FIG. 6. Only the fourth wiring layer 111, the conductive layer 116 and the protection film 113 are shown in FIG. 6 for the sake of simplicity.

Figure 7:
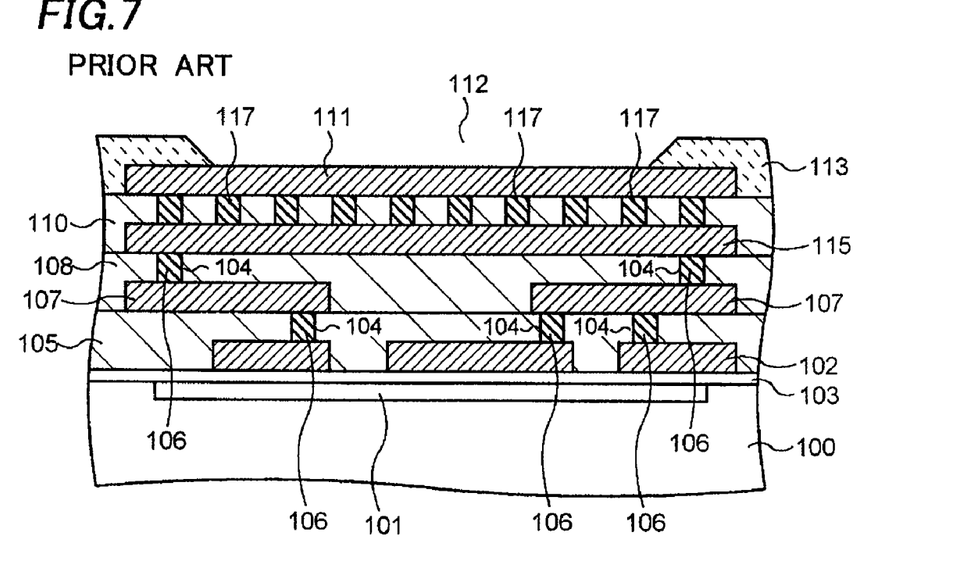
FIG. 7 is a cross-sectional view showing a conventional semiconductor device.
Figure 8:
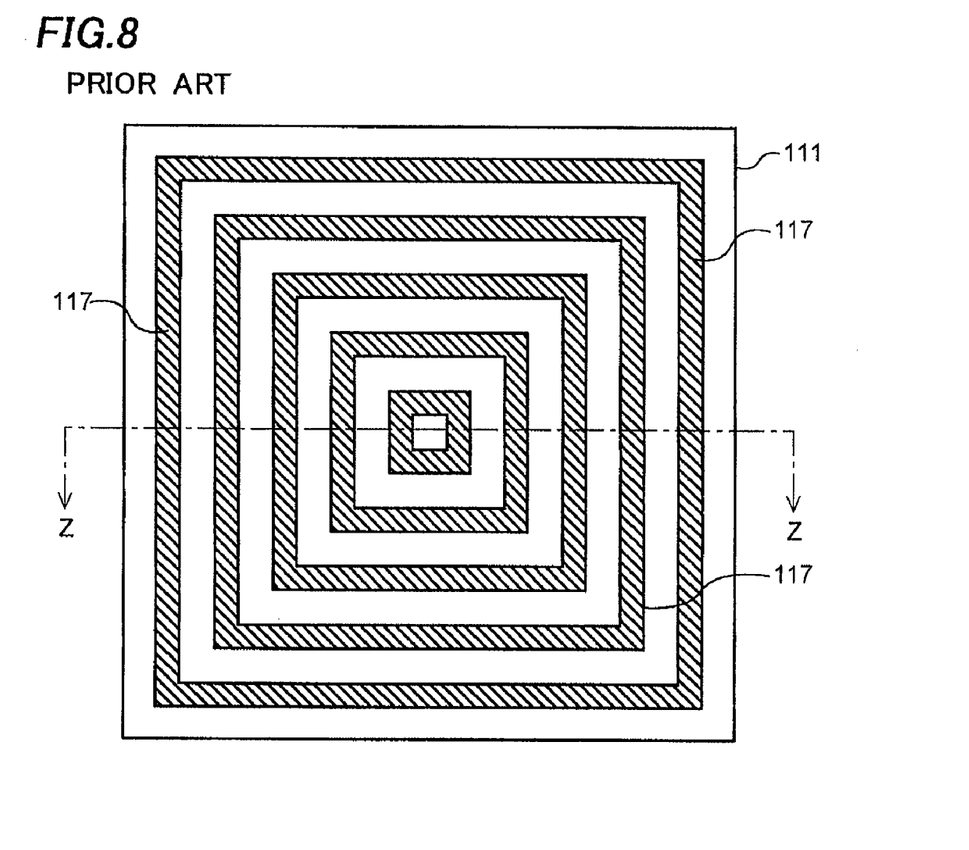
FIG. 8 is a plan view showing the conventional semiconductor device.

Also, there is proposed a structure in which a multitude of rectangular rings of conductive layers 117 that electrically connect the fourth wiring layer 111 with the third wiring layer 115 is disposed over approximately all the area that overlaps the fourth wiring layer 111, as shown in FIG. 7 and FIG. 8. With the structure provided with the multitude of rectangular ring-shaped conductive layers 117, the downward propagation of cracks 114 is blocked by the third wiring layer 115 while lateral propagation, that is the propagation in directions parallel to the surface of the semiconductor substrate 100, of the cracks 114 caused in the third interlayer insulation film 110 is suppressed by the rectangular ring-shaped conductive layers 117. FIG. 7 is a cross-sectional view of a section Z-Z shown in FIG. 8. Only the fourth wiring layer 111 and the conductive layers 117 are shown in FIG. 8 for the sake of simplicity The technology mentioned above is described in Japanese Patent Application Publication No. H06-196525, for example.

Probe testing showed that the mechanical stress imposed on the bonding pad was not sufficiently relaxed by the third wiring layer 115 with the conventional structures described above.

In recent years, in order to reduce a die size, bonding pads have come to be formed over a region where the device elements are formed. Therefore, the mechanical stress reaches the device elements if the third wiring layer 115 can not sufficiently relax the mechanical stress imposed on the bonding pad. Dimensions of semiconductor elements constituting the device elements and connecting wirings have been reduced year by year. They are susceptible to failure and their electric characteristics (a threshold voltage of a transistor, for example) are prone to be varied when the mechanical stress reaches them.

SUMMARY OF THE INVENTION

This invention is directed to solve the problems addressed above and has following features. This invention offers a semiconductor device having a semiconductor substrate, a wiring layer disposed on a surface of the semiconductor substrate, an interlayer insulation film disposed to cover the wiring layer, a conductive layer that is formed in an opening in the interlayer insulation film and electrically connected with the wiring layer, and an uppermost wiring layer disposed on the interlayer insulation film and electrically connected with the wiring layer through the conductive layer, wherein the interlayer insulation film is composed of a plurality of hexagonal column-shaped interlayer insulation films arrayed in a honeycomb pattern and the conductive layer is disposed to surround the hexagonal column-shaped interlayer insulation films.

DETAILED DESCRIPTION OF THE INVENTION

Figure 1:
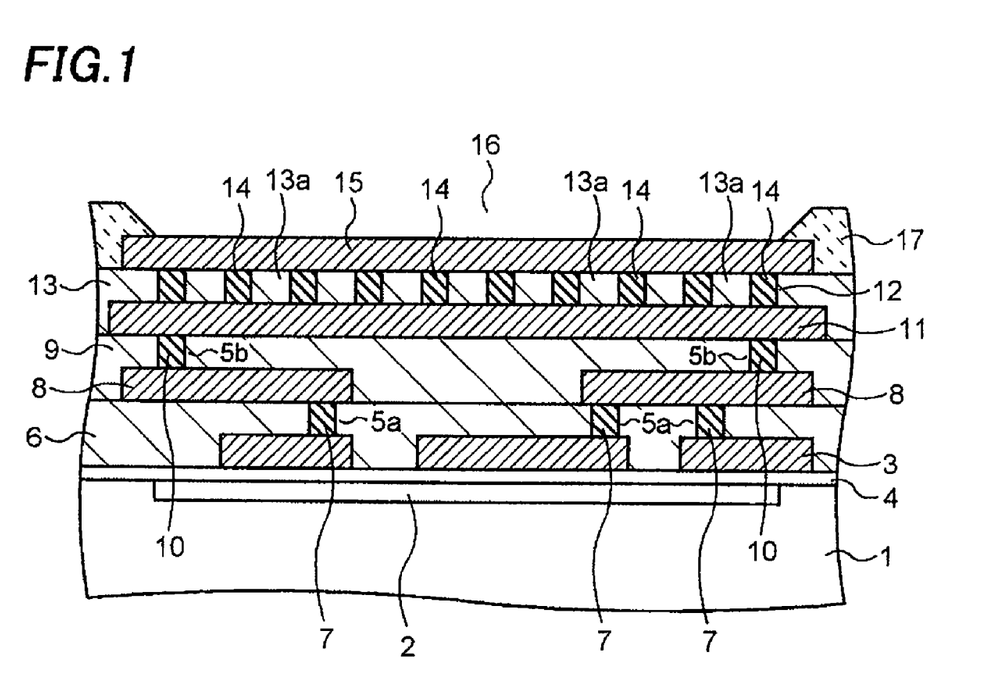
FIG. 1 is a cross-sectional view showing a semiconductor device according to an embodiment of this invention.
Figure 2:
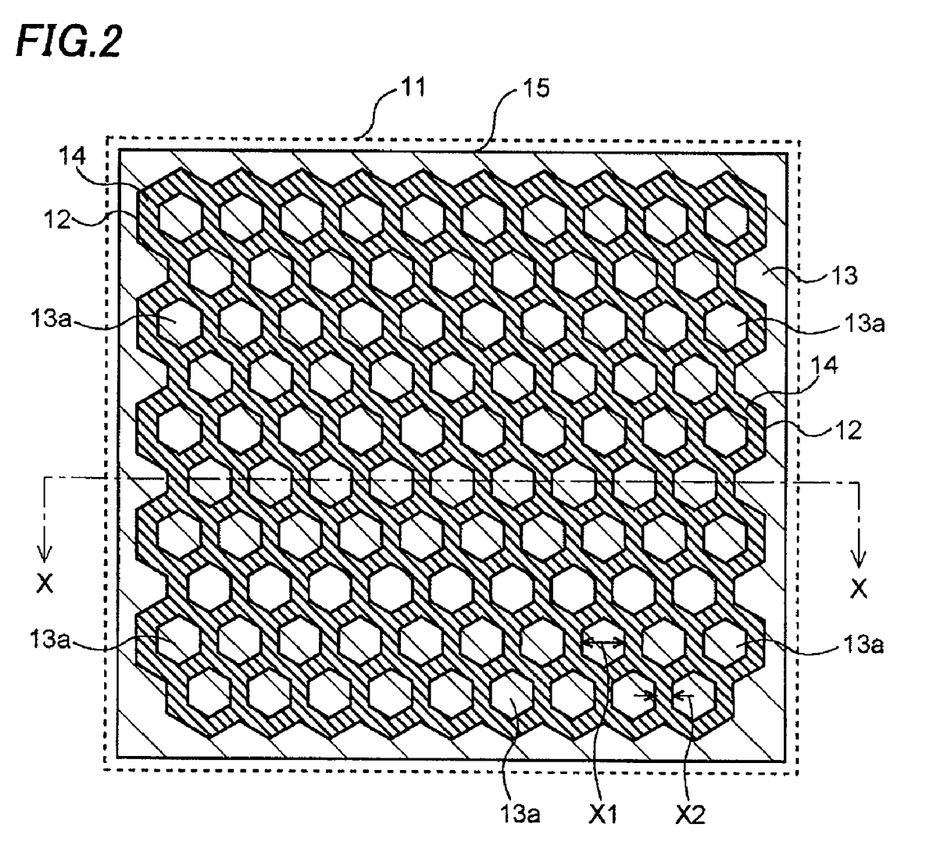
FIG. 2 is a plan view showing the semiconductor device according to the embodiment of this invention.

An embodiment of this invention is hereinafter described referring to the figures. FIG. 1 is a cross-sectional view showing an outline of a semiconductor device according to the embodiment of this invention. FIG. 2 is a plan view of the semiconductor device. FIG. 1 corresponds to a cross-sectional view of a section X-X shown in FIG. 2. FIGS. 1 and 2 show only a region where a bonding pad is formed, and the other regions (regions where an internal circuit and other bonding pads are formed) on a semiconductor substrate are omitted for the sake of simplicity.

Device elements 2 composed of a multitude of semiconductor elements such as transistors and capacitors are formed on a surface of a semiconductor substrate 1 that is made of silicon or the like. The device elements 2 constitute a logic circuit or a driver circuit, for example. A first wiring layer 3 that is electrically connected with the device elements 2 or other semiconductor elements is formed on the surface of the semiconductor substrate 1 through an insulation film 4 that is made of a silicon oxide film or the like. The first wiring layer 3 is made of aluminum, for example. A second wiring layer 8, a third wiring layer 11 and a fourth wiring layer 15, which will be described later, are made similarly.

A first interlayer insulation film 6 having via holes 5a is formed on the insulation film 4 to cover the first wiring layer 3. A first conductive layer 7 made of tungsten, aluminum or the like is formed in each of the via holes 5a. Although not shown in the figure, a barrier metal layer (a titanium tungsten (TiW) layer or titanium nitride (TiN) layer, for example) is formed between the first interlayer insulation film 6 and the first conductive layer 7. A barrier metal layer is similarly formed between a second interlayer insulation film 9 and a second conductive layer 10 and between a third interlayer insulation film 13 and a third conductive layer 14.

The second wiring layer 8 electrically connected with the first wiring layer 3 through the first conductive layer 7 is formed on the first interlayer insulation film 6. The second interlayer insulation film 9 having via holes 5b is formed on the first interlayer insulation film 6 to cover the second wiring layer 8, and the second conductive layer 10 is formed in each of the via holes 5b.

The third wiring layer 11 electrically connected with the second wiring layer 8 through the second conductive layer 10 is formed on the second interlayer insulation film 9. It is preferable that the third wiring layer 11 is located so as to overlap the fourth wiring layer 15 and is larger in area than an opening (a pad opening 16 that is to be described) in a protection film 17. With the structure described above, the third wiring layer 11 serves as a stopper wiring layer to suppress downward propagation of cracks by relaxing a load imposed on the fourth wiring layer 15 as well as serving as an electrical interconnection between the second wiring layer 8 and the fourth wiring layer 15. The third interlayer insulation film 13 having via holes 12 is formed on the second interlayer insulation film 9 to cover the third wiring layer 11. The third conductive layer 14 is formed in each of the via holes 12.

The fourth wiring layer 15 that is electrically connected with the third wiring layer 11 through the third conductive layer 14 is formed on the third interlayer insulation film 13. The fourth wiring layer 15 makes an uppermost wiring layer in this embodiment and serves as the bonding pad. Therefore, a test probe touches the fourth wiring layer 15 in probe testing, and a metal lead wire is connected to the fourth wiring layer 15 in wire bonding. The fourth wiring 15 overlaps with the device elements 2 and wirings connected with them when looked from a position vertically above the semiconductor substrate 1, so that a layout area and a size of the semiconductor device are reduced. The protection film 17 having the pad opening 16 on the fourth wiring layer 15 is formed on the third interlayer insulation film 13.

A feature of this embodiment is in a structure made of the via hole 12, the third interlayer insulation film 13 and the third conductive layer 14. That is, the third interlayer insulation film 13 according to this embodiment is structured by arraying a plurality of hexagonal column-shaped interlayer insulation films 13a at a regular interval in a top to bottom direction, in a left to right direction and in a diagonal direction, as shown in FIG. 2. And the via hole 12 and the third conductive layer 14 are formed to surround each of the hexagonal column-shaped interlayer insulation films 13a. When a width of the hexagonal column-shaped interlayer insulation film 13a is X1 and a width of the third conductive layer 14 is X2, X1 is formed to be approximately twice of X2, for example. Since the hexagonal column-shaped interlayer insulation films 13a collectively form a pattern of honeycomb, the structure made of the third interlayer insulation film 13 and the third conductive layer 14 is hereafter referred to as a honeycomb structure.

The honeycomb structure is formed by a following manufacturing process, for example. First, an interlayer insulation film such as a silicon oxide film is deposited on the second interlayer insulation film 9 and the third wiring layer 11, and a resist layer is applied in order to shape the interlayer insulation film into a honeycomb-pattern. Next, the interlayer insulation film is patterned using the resist layer as a mask to form the hexagonal column-shaped interlayer insulation films 13a and the via holes 12. When X1 is to be made approximately twice of X2, the resist layer is designed so that X1 is approximately three times of X2. Next, a metallic material such as tungsten or aluminum is buried in the via holes 12, and the metallic material deposited outside the via holes 12 is subsequently removed by CMP (Chemical Mechanical Polishing) to form the third conductive layer 14, and the honeycomb structure according to the embodiment is completed.

The third conductive layer 14 and the fourth wiring layer 15 may be formed in the same process step by burying aluminum in the via holes 12 and depositing aluminum on the third insulation film 13 at the same time. Or the fourth wiring layer 15 made of aluminum may be formed in a separated process step after forming the third conductive layer 14 by burying tungsten in the via holes 12.

Next, rates of occurrences of cracks in the structure (hereafter referred to as a first structure) of the semiconductor device according to the embodiment by probe testing are described taking concrete examples. Rates (failure rates) of occurrences of cracks (4 M-3 M cracks) between the fourth wiring layer 15 and the third wiring layer 11 and rates (failure rates) of occurrences of cracks (3 M-2 M cracks) between the third wiring layer 11 and the second wiring layer 8 were measured using two kinds of probe cards that are a probe card A and a probe card B. Although an amount of overdrive (strength of probing) in a normal probing test conducted in a manufacturing process of the semiconductor device is about 30 μm, five levels of higher amount of overdrive than in the normal probing test were conducted three times for each level in this time of tests to investigate an effect of the first structure on relaxation of the mechanical stress. (Refer to results of evaluations shown in FIG. 3.) Probes of the probe card A are more flexible in the probing test than probes of the probe card B.

Similar probing tests were conducted on the structure (a second structure) that is already described referring to FIG. 5 and FIG. 6 and the structure (a third structure) that is already described referring to FIG. 7 and FIG. 8 as comparison examples to test results on the first structure.

Figure 3:
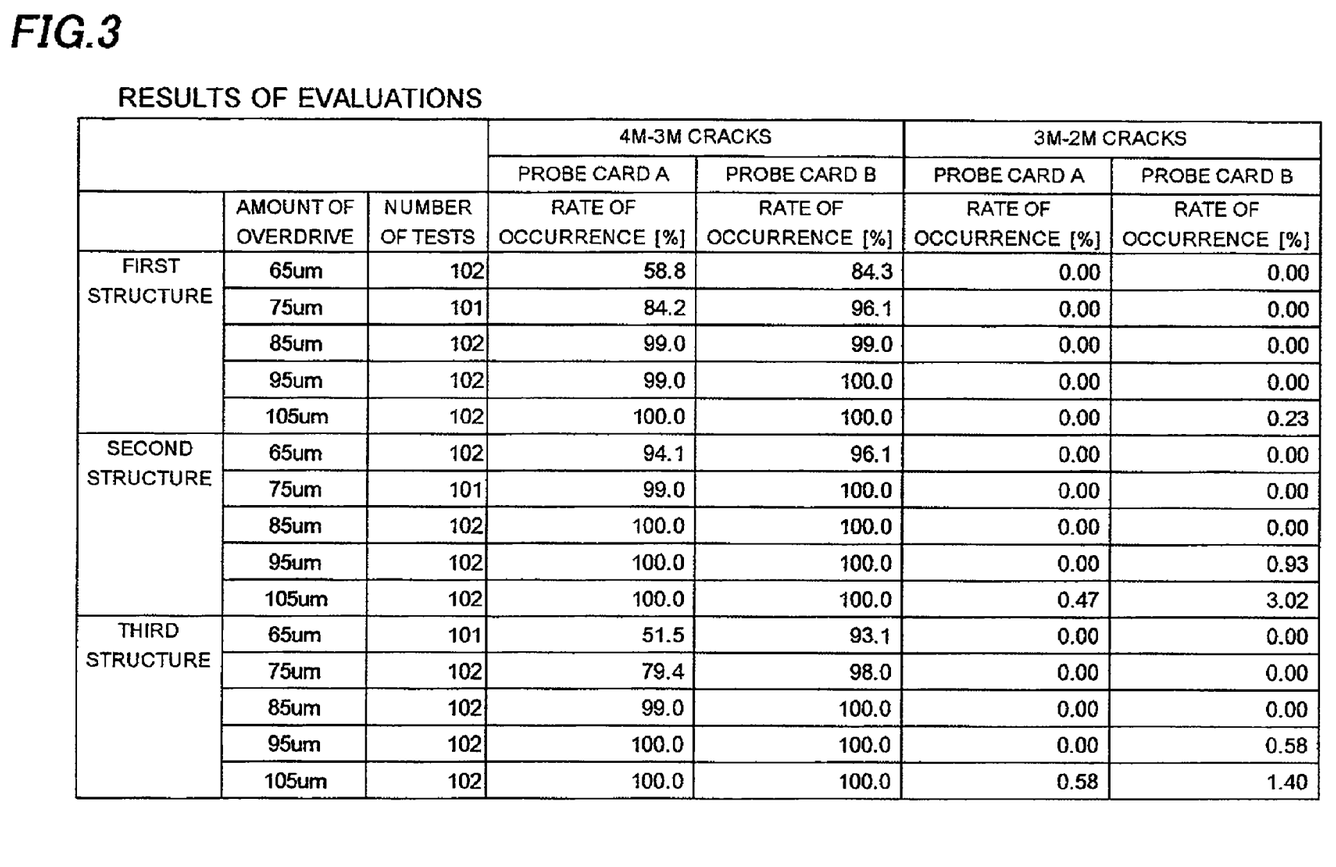
FIG. 3 is a table showing rates of occurrences of cracks in the semiconductor device according to the embodiment of this invention.

As seen from results of evaluations shown in FIG. 3, when the probe card A was used, the rate (failure rates) of occurrences of the 4 M-3 M cracks between the fourth wiring layer 15 and the third wiring layer 11 were 94.1-100% in the second structure and 51.5-100% in the third structure, while the rates of occurrences of 4 M-3 M cracks were 58.8-100% in the first structure. When the probe card B was used, the rates of occurrences of the 4 M-3 M cracks were 96.1-100% in the second structure and 93.1-100% in the third structure, while the rates of occurrences of the 4 M-3 M cracks were 84.3-100% in the first structure. As described above, it appears that the rates of occurrences of the 4 M-3 M cracks between the fourth wiring layer 15 and the third wiring layer 11 are significantly reduced in the first and third structures than in the second structure.

Whether the mechanical stress reaches the semiconductor elements is important in considering the reliability of the semiconductor device. From this standpoint of view, the rates of occurrences of the 3 M-2 M cracks between the third wiring layer 11 and the second wiring layer 8 were studied.

As seen from the results of evaluations shown in FIG. 3, when the probe card A was used, the rates (failure rates) of occurrences of the 3 M-2 M cracks between the third wiring layer 11 and the second wiring layer 8 were 0.00-0.47% in the second structure and 0.00-0.58% in the third structure. In both structures, the 3 M-2 M cracks were caused when the amount of overdrive was 105 μm. In the first structure, on the other hand, the rates of occurrences of the 3 M-2 M cracks were 0.00% for any amount of overdrive including 105 μm. These results show that the first structure is more effective in suppressing downward propagation of the mechanical stress beyond the third wiring layer 11 than the other structures.

When the probe card B was used, the rates of occurrences of the 3 M-2 M cracks were 0.00-3.02% in the second structure and 0.00-1.40% in the third structure. In both structures, the 3 M-2 M cracks were caused when the amount of overdrive was 95 μm and 105 μm. In the first structure, on the other hand, the rate of occurrence of the 3 M-2 M cracks was 0.00% for up to 95 μm of the overdrive and remained only 0.23% even when the amount of overdrive was 105 μm. When the amount of overdrive was 105 μm, the rate of occurrence of the 3 M-2 M cracks in the first structure was 1/15 of that in the second structure and 1/7 of that in the third structure. These results also show that the first structure is significantly more effective in suppressing downward propagation of the mechanical stress beyond the third wiring layer 11 than the other structures.

It appears from the results of probe testing described above that the first structure is more effective in suppressing downward propagation of the mechanical stress beyond the second wiring layer 8 and the third wiring layer 11, and makes it more difficult for the mechanical stress to reach the semiconductor elements than the other structures. It is confirmed that, even after wire bonding as well as after sealing with molding resin, the first structure is more resistant to occurrence of the cracks and more effective in suppressing downward propagation of the mechanical stress beyond the second wiring layer 8 and the third wiring layer 11 than the other structures.

As described above, with the structure according to the embodiment, the mechanical stress applied to the bonding pad (the fourth wiring layer 15) is relaxed by the honeycomb structure (the third interlayer insulation film 13 and the third conductive layer 14) not only in the probe testing but also in wire bonding, in forming bump electrodes and in sealing. As a result, downward propagation of physical damages beyond the honeycomb structure is suppressed to improve the reliability of the semiconductor device.

In addition, even when the cracks are caused in some of the third interlayer insulation films 13a, the cracks are not easily propagated to other third interlayer insulation films 13a, because each of the hexagonal column-shaped interlayer insulation films 13a is separated from the other by the third conductive layer 14.

X1 is approximately twice of X2 in the embodiment described above. This invention is not limited to the above.

Close investigation on a surface of the fourth wiring layer 15 showed that the fourth wiring layer 15 was dented in regions above the third conductive layer 14 compared with the fourth wiring layer 15 in regions above the hexagonal column-shaped interlayer insulation films 13a. It appeared that strength of bonding between a bonding wire and the fourth wiring layer 15 was weakened when the surface of the fourth wiring layer 15 was severely dented.

In order to solve the problem described above, the strength of bonding was studied for each of cases where X2 is twice, three times, four times, six times, eight times and ten times of X1. To be more specific, the number of bonding failures, that were disconnections of the bonding wire from the fourth wiring layer 15, was counted when approximately 2000 times of wire bonding were conducted. Two bonding failures in which the bonding wire was disconnected from the fourth wiring layer 15 were found in the case where X1 was twice of X2. On the other hand, no bonding failures were found in the case where X1 was three times, four times, six times, eight times or ten times of X2. Therefore, it is preferable that X1 is equal to or larger than three times of X2 in order to secure sufficient strength of bonding between the bonding wire and the fourth wiring layer 15.

Making X1 equal to or larger than three times of X2 is particularly effective when the fourth wiring layer 15 made of metallic material such as aluminum is formed in the separate process step after forming the third conductive layer 14 by burying the metallic material such as tungsten in the via holes 12 and planarizing the third conductive layer 14 by etching back, because the third conductive layer 14 after the etching back is more easily dented compared with the surface of the third interlayer insulation film 13.

It is apparent that this invention is not limited to the embodiment described above and may be modified within the scope of the invention.

For example, this invention may be applied to four or more than four layers of multi-wiring layer structure. This invention is applicable to a multi-wiring layer structure including two or more than two wiring layers. That is, it is good enough that at least one of interlayer insulation films formed between an uppermost wiring layer (bonding pad) and a lowermost wiring layer is made of hexagonal column-shaped interlayer insulation films described above and that a conductive layer is formed so as to surround each of the hexagonal column-shaped interlayer insulation films. Although shapes of the fourth wiring layer 15 and the third wiring layer 11 are squares in the plan view shown in FIG. 2, they may be in other shapes such as a rectangle or a triangle. This invention can be widely applied as a technology to relax a mechanical stress applied to a bonding pad in a semiconductor device having a multi-wiring layer structure.

According to the embodiment of this invention, the mechanical stress applied to the bonding pad is relaxed by the honeycomb structure made of the hexagonal column-shaped interlayer insulation films and the conductive layer.

What is claimed is:

1. A semiconductor device comprising:
   a semiconductor substrate;
   a wiring layer disposed on the semiconductor substrate;
   an interlayer insulation film and a conductive layer that are disposed on the wiring layer so that the conductive layer is electrically connected to the wiring layer and forms a honeycomb structure with respect to a plane parallel to a primary plane of the semiconductor substrate and so that the interlayer insulation film fills hexagonal columns of the honeycomb structure; and
   an uppermost wiring layer disposed on the interlayer insulation film and the conductive layer so as to be electrically connected to the wiring layer through the conductive layer,
   wherein, in the plane parallel to the primary plane of the semiconductor substrate, a distance between a pair of opposing side surfaces of the hexagonal column of the honeycomb structure is equal to or larger than three times of a width of the conductive layer.

2. The semiconductor device of claim 1, further comprising another interlayer insulation film disposed between the semiconductor substrate and the wiring layer and a device element formed in the semiconductor substrate, wherein the uppermost wiring layer covers the device element.

3. The semiconductor device of claim 1, wherein the wiring layer is larger in area than the uppermost wiring layer.

4. The semiconductor device of claim 2, wherein the wiring layer is larger in area than the uppermost wiring layer.

5. The semiconductor device of claim 1, wherein the uppermost wiring layer comprises a bonding pad.

6. The semiconductor device of claim 2, wherein the uppermost wiring layer comprises a bonding pad.

7. The semiconductor device of claim 1, further comprising a protection film disposed on the uppermost wiring layer and having an opening in which a portion of the uppermost wiring layer is exposed, wherein the wiring layer is larger than the opening.

8. The semiconductor device of claim 2, further comprising a protection film disposed on the uppermost wiring layer and having an opening in which a portion of the uppermost wiring layer is exposed, wherein the wiring layer is larger than the opening.

9. The semiconductor device of claim 5, further comprising a protection film disposed on the uppermost wiring layer and having an opening in which a portion of the uppermost wiring layer is exposed, wherein the wiring layer is larger than the opening.

10. The semiconductor device of claim 6, further comprising a protection film disposed on the uppermost wiring layer and having an opening in which a portion of the uppermost wiring layer is exposed, wherein the wiring layer is larger than the opening.

* * * * *